(12) United States Patent
Goto et al.

(10) Patent No.: US 12,422,486 B2
(45) Date of Patent: Sep. 23, 2025

(54) INSPECTION DEVICE FOR ROTARY ELECTRIC MACHINE, INSPECTION SYSTEM FOR ROTARY ELECTRIC MACHINE, INSPECTION METHOD FOR ROTARY ELECTRIC MACHINE, AND ROTARY ELECTRIC MACHINE TO BE INSPECTED USING INSPECTION DEVICE

(71) Applicant: MITSUBISHI GENERATOR CO., LTD., Kobe (JP)

(72) Inventors: Daichi Goto, Tokyo (JP); Naotaka Tsujimura, Tokyo (JP); Yoshihiro Morimoto, Tokyo (JP)

(73) Assignee: Mitsubishi Generator Co., LTD., Kobe (JP)

( * ) Notice: Subject to any disclaimer, the term of this patent is extended or adjusted under 35 U.S.C. 154(b) by 56 days.

(21) Appl. No.: 18/259,816

(22) PCT Filed: May 25, 2021

(86) PCT No.: PCT/JP2021/019831
§ 371 (c)(1),
(2) Date: Jun. 29, 2023

(87) PCT Pub. No.: WO2022/249290
PCT Pub. Date: Dec. 1, 2022

(65) Prior Publication Data
US 2024/0085480 A1    Mar. 14, 2024

(51) Int. Cl.
*G01R 31/34*    (2020.01)

(52) U.S. Cl.
CPC .................................. *G01R 31/34* (2013.01)

(58) Field of Classification Search
CPC ........ G01R 31/34; H02K 15/00; H02K 3/487; H02K 21/22; H02K 3/47; H02K 11/33;
(Continued)

(56) References Cited

U.S. PATENT DOCUMENTS

| 5,650,579 A | * | 7/1997 | Hatley | ................. B62D 55/065 |
| | | | | 348/E7.086 |
| 6,100,711 A | * | 8/2000 | Hatley | .................. H02K 15/00 |
| | | | | 324/545 |

(Continued)

FOREIGN PATENT DOCUMENTS

| JP | 2002209363 A | 7/2002 |
| JP | 2017138315 A | 8/2017 |

(Continued)

OTHER PUBLICATIONS

International Search Report (PCT/ISA/210) with translation and Written Opinion (PCT/ISA/237) mailed on Aug. 17, 2021 by the Japanese Patent Office as the International Searching Authority for International Application No. PCT/JP2021/019831. (10 pages).

(Continued)

*Primary Examiner* — Vinh P Nguyen
(74) *Attorney, Agent, or Firm* — BUCHANAN, INGERSOLL & ROONEY PC (57) ABSTRACT

An inspection device inspects an inspection target part by being inserted into a gap between an inner circumferential surface of a stator and an outer circumferential surface of a rotor of a rotary electric machine. The inspection device includes: a traveling body which is attached to a base frame and moves the base frame in an axial direction in the gap; a probe which inspects the inspection target part; a radial-movement portion which moves the probe in a radial direction perpendicular to the axial direction and a circumferential direction; and a circumferential-movement portion which moves the probe in the circumferential direction in the base frame.

18 Claims, 10 Drawing Sheets

(58) Field of Classification Search
CPC ...... H02K 5/1735; H02K 3/04; H02K 11/225; H02K 21/14; H02K 7/085; H02K 21/26; H02K 7/006; H02K 11/27; H02K 11/215; G01N 29/225; G01N 29/265; G01N 21/954; G01N 2021/9518; F16L 55/40; F16L 2101/30; H04N 23/54; H04N 23/57; B66F 3/22; H02P 27/08; H02P 29/00; H02P 6/16; H02P 9/305

See application file for complete search history.

(56) References Cited

U.S. PATENT DOCUMENTS

| | | | | |
|---|---|---|---|---|
| 7,201,055 | B1* | 4/2007 | Bagley | .................. G01R 31/34 73/620 |
| 10,197,538 | B2* | 2/2019 | Alford | .................. G01N 27/90 |
| 10,434,641 | B2* | 10/2019 | Akin | ....................... G02B 23/24 |
| 12,038,119 | B2* | 7/2024 | Akin | ....................... F16L 55/40 |
| 2007/0089544 | A1 | 4/2007 | Bagley et al. | |
| 2008/0087112 | A1 | 4/2008 | Bagley et al. | |
| 2017/0219533 | A1 | 8/2017 | Alford et al. | |

FOREIGN PATENT DOCUMENTS

| | | | | |
|---|---|---|---|---|
| WO | 2010/079730 | A1 | 7/2010 | |
| WO | 2021/034611 | A1 | 2/2021 | |
| WO | WO2021034611 | * | 2/2021 | ............. G01R 31/34 |

OTHER PUBLICATIONS

Notice of Reasons for Refusal with translation dated Dec. 14, 2021 issued by the Japanese Patent Office in corresponding Japanese Patent Application No. 2021-562121. (5 pages).

Office Action dated Nov. 28, 2024, issued in the corresponding Canadian Patent Application No. 3,207,889, 4 pages.

Extended European Search Report dated Jun. 28, 2024, issued in the corresponding European Patent Application No. 21942945.3, 7 pages.

* cited by examiner

INSPECTION DEVICE FOR ROTARY ELECTRIC MACHINE, INSPECTION SYSTEM FOR ROTARY ELECTRIC MACHINE, INSPECTION METHOD FOR ROTARY ELECTRIC MACHINE, AND ROTARY ELECTRIC MACHINE TO BE INSPECTED USING INSPECTION DEVICE

TECHNICAL FIELD

The present disclosure relates to an inspection device for a rotary electric machine, an inspection system for a rotary electric machine, an inspection method for a rotary electric machine, and a rotary electric machine to be inspected using an inspection device.

BACKGROUND ART

A wedge for retaining a winding is attached to a groove of a rotor of a rotary electric machine. During operation of the rotary electric machine, the wedge is subjected to a centrifugal force by the winding in the groove and the wedge itself, so that a crack might occur at a surface of the wedge or inside thereof. The crack occurring at the wedge of the rotor can cause failure of the rotary electric machine. Therefore, it is recommended that, in accordance with operation years and operation conditions, the rotor is pulled out from a stator and a crack occurrence condition is inspected.

In conventional inspection for the wedge of the rotary electric machine, a long stop period is needed due to work for pulling out the rotor, the cost is high, the utilization factor is reduced, and the stator and the rotor might be damaged. Therefore, a method for inspecting the rotary electric machine without pulling out the rotor from the stator is proposed. For example, Patent Document 1 discloses a device and a method for performing inspection remotely by inserting the device between a stator and a rotor of a rotary electric machine without disassembling the stator and the rotor of the rotary electric machine.

CITATION LIST

Patent Document

Patent Document 1: Japanese Laid-Open Patent Publication No. 2017-138315

SUMMARY OF THE INVENTION

Problem to be Solved by the Invention

In the conventional inspection device for the rotary electric machine, when the rotary electric machine is stopped, the rotor can stop at any angle relative to arrangement of teeth of the stator, and this is not taken into consideration sufficiently.

Thus, there is a problem that a rotor wedge range where a device attracted at a tooth of the stator can perform inspection is constrained by a position on the stator at which the device is attracted.

In addition, in a case of inspecting all wedges of the rotor of the rotary electric machine against constraints of a movement range in the circumferential direction, the device needs to be moved from a tooth to another tooth of the stator and placed there many times, so that an inspection period is prolonged, thus having a problem that efficiency of inspection work is reduced.

In addition, in a case where two or more wedges of the rotor are present between adjacent stator teeth, when the device is placed, the position of the device cannot be finely controlled relative to arrangement of wedges of the stator, so that there might be some wedges for which a probe cannot properly contact with surfaces thereof. In a case of inspecting such wedges with which the probe cannot contact, the stopped rotor needs to be rotated to adjust the rotation position. However, rotating the rotor having a weight of 1 ton to 10 tons at each time has a problem that efficiency of inspection work is reduced.

The present disclosure has been made to solve the above problems, and an object of the present disclosure is to provide an inspection device for a rotary electric machine, an inspection system for a rotary electric machine, an inspection method for a rotary electric machine, and a rotary electric machine to be inspected using an inspection device, that can reduce constraints on movement and improve efficiency of inspection work.

Means to Solve the Problem

An inspection device for a rotary electric machine according to the present disclosure is an inspection device for a rotary electric machine, which inspects an inspection target part by being inserted into a gap between an inner circumferential surface of a stator and an outer circumferential surface of a rotor of the rotary electric machine, the inspection device including: a base frame; a traveling body which is attached to the base frame and moves the base frame in an axial direction in the gap; a probe which inspects the inspection target part; a radial-movement portion which moves the probe in a radial direction perpendicular to the axial direction and a circumferential direction; and a circumferential-movement portion which moves the probe in the circumferential direction in the base frame.

An inspection system for a rotary electric machine according to the present disclosure includes: the above inspection device; a control unit which controls movement of the probe of the inspection device in at least one of the circumferential direction and the radial direction; and a display unit which displays a state of the inspection device.

An inspection method for a rotary electric machine according to the present disclosure is an inspection method for a rotary electric machine, in which, by the above inspection device for the rotary electric machine, a plurality of inspection target parts at different locations in the circumferential direction are inspected in a state in which the rotor and the stator of the rotary electric machine are combined, the inspection method including the steps of: inserting the inspection device into the gap between the stator and the rotor and moving the inspection device to one of the inspection target parts; inspecting the one inspection target part by the probe; and moving the probe so as to be opposed to another one, of the inspection target parts, that is different from the one inspection target part and is included in a range where the probe is movable in the circumferential direction in the inspection device, and inspecting the other inspection target part.

A rotary electric machine to be inspected using an inspection device according to the present disclosure is a rotary electric machine to be inspected using the above inspection device.

An inspection device according to the present disclosure is an inspection device for a rotary electric machine, which inspects an inspection target part by being inserted into a gap between an inner circumferential surface of a stator and an outer circumferential surface of a rotor of the rotary electric machine, the inspection device including: a base frame; a traveling body which is attached to the base frame and moves the base frame in an axial direction in the gap; a probe which inspects the inspection target part; a radial-movement portion which moves the probe in a radial direction perpendicular to the axial direction and a circumferential direction; and a circumferential-adjustment portion which moves the traveling body within a range of a width in the circumferential direction of a tooth of the stator and adjusts a position in the circumferential direction of the probe relative to the inspection target part.

Effect of the Invention

The inspection device for the rotary electric machine, the inspection system for the rotary electric machine, the inspection method for the rotary electric machine, and the rotary electric machine to be inspected using the inspection device according to the present disclosure can reduce constraints on movement and improve efficiency of inspection work.

DESCRIPTION OF EMBODIMENTS

The present disclosure is for performing inspection for an inspection target part of a rotary electric machine through remote control by inserting an inspection device into a gap between a stator and a rotor of the rotary electric machine while the stator and the rotor of the rotary electric machine remain combined. Therefore, as a matter of course, the inspection device has such a dimension setting and a configuration that the inspection device can be placed in the gap between the stator and the rotor of the rotary electric machine. In the following description of embodiments, directions of the rotary electric machine are defined as a circumferential direction Z, an axial direction Y, and a radial direction X. Therefore, also in the stator and the rotor, the same directions are applied. In addition, the inspection device of the present disclosure is described using these directions as a reference.

Embodiment 1

Figure 1:
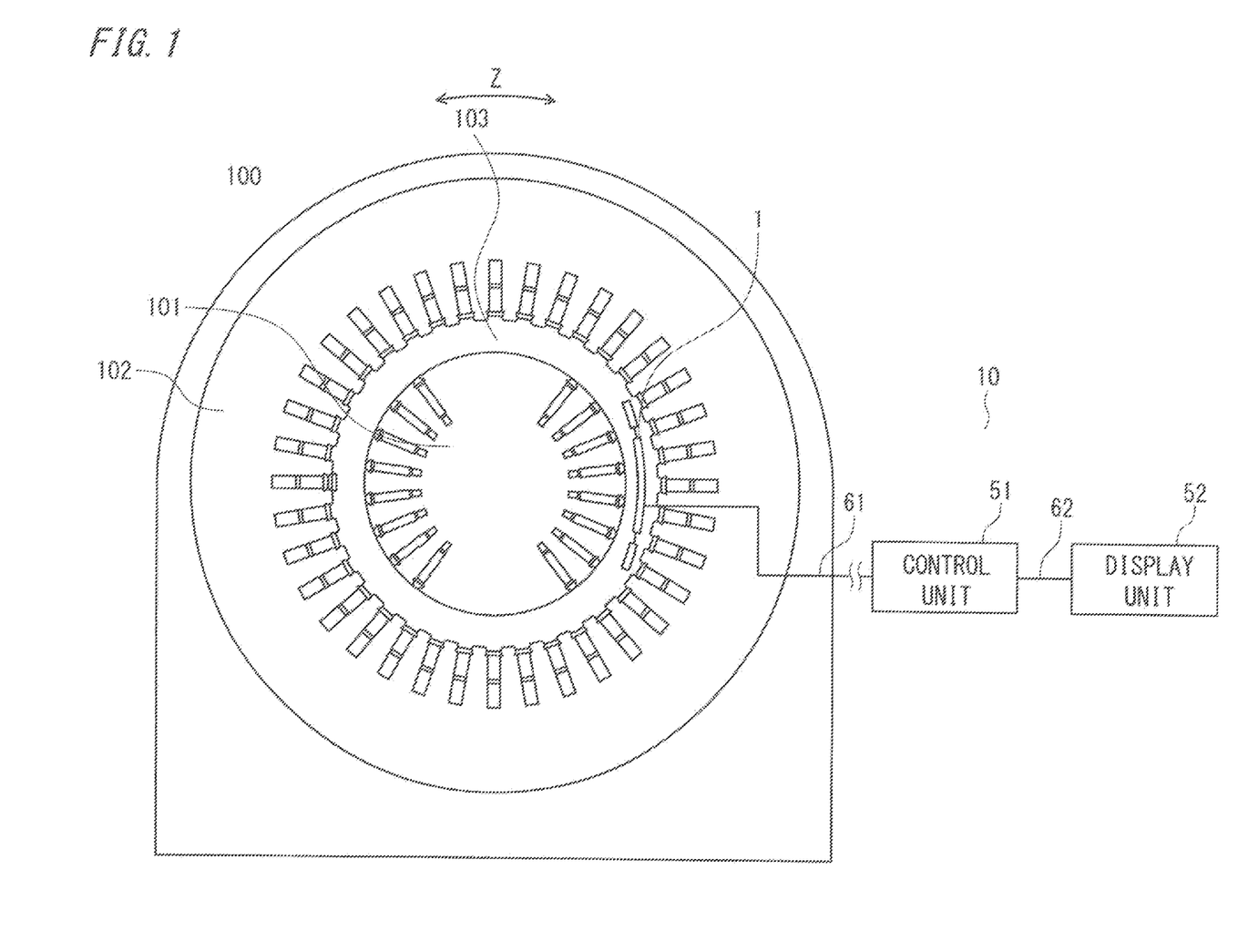
FIG. 1 is a schematic diagram showing the configurations of a rotary electric machine, an inspection device for the rotary electric machine, and an inspection system for the rotary electric machine according to embodiment 1.
Figure 2:
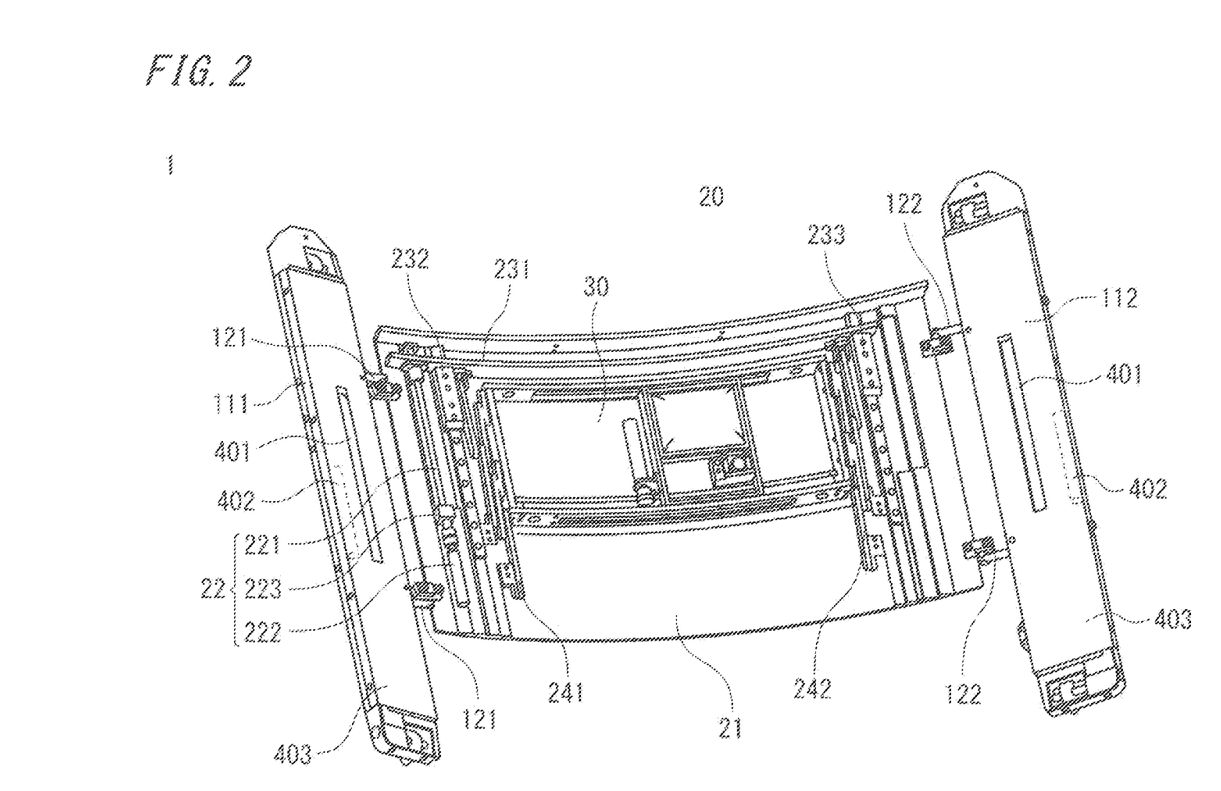
FIG. 2 is a perspective view showing the schematic configuration of the inspection device shown in FIG. 1.
Figure 3:
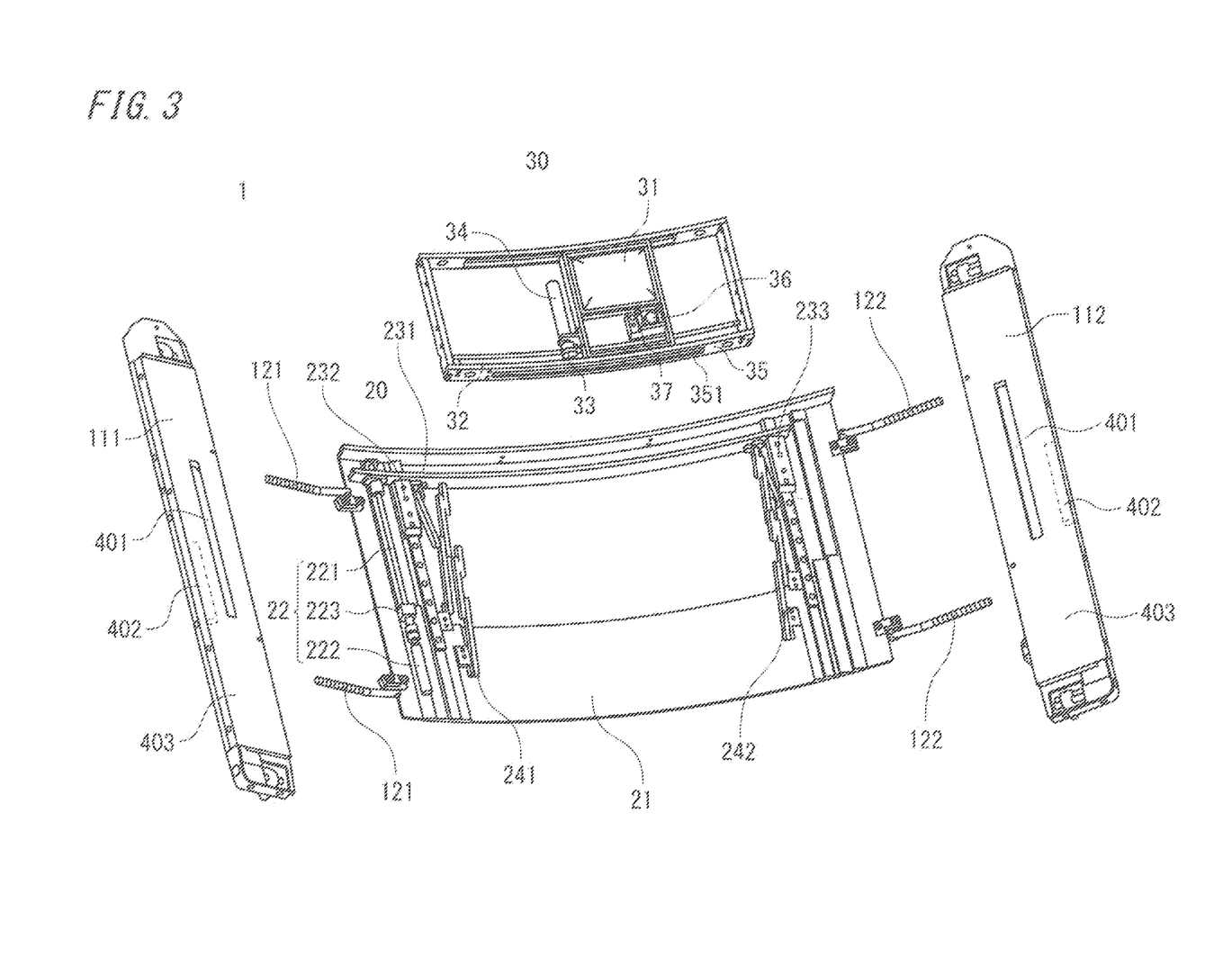
FIG. 3 is an exploded perspective view illustrating the schematic configuration of the inspection device shown in FIG. 2.
Figure 4:
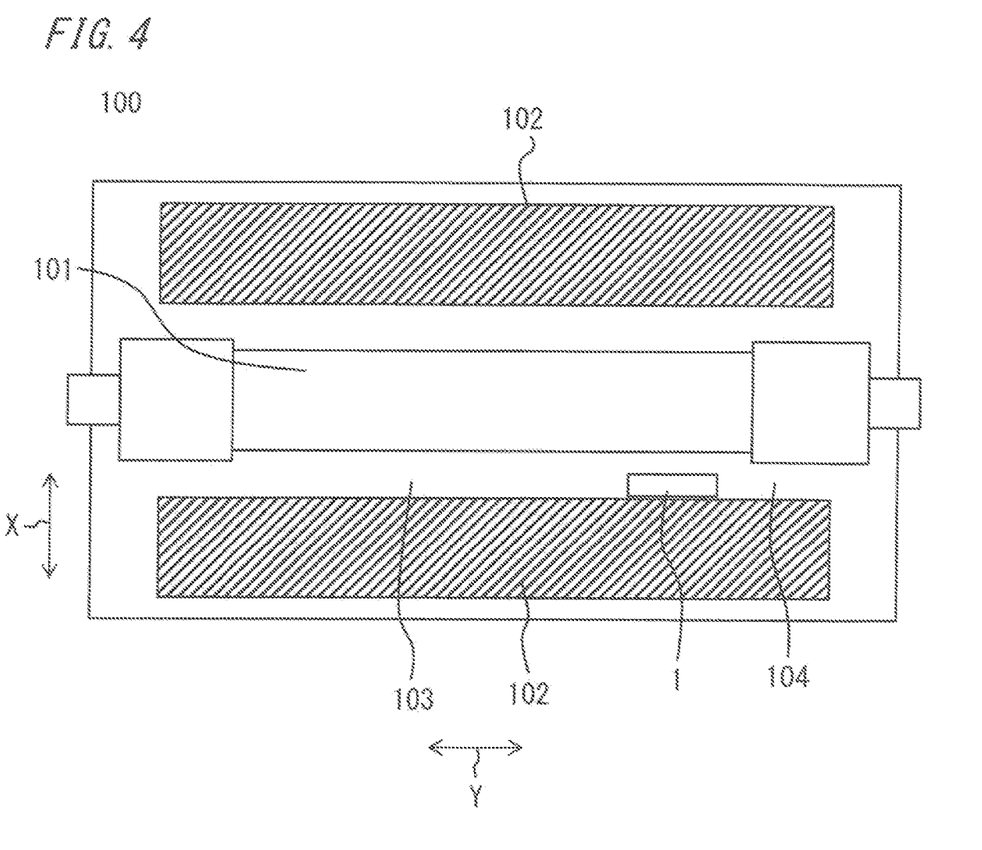
FIG. 4 is a sectional view along an axial direction showing the states of the rotary electric machine and the inspection device shown in FIG. 1.

FIG. 1 is a schematic diagram showing the configurations of a rotary electric machine, an inspection device for the rotary electric machine, and an inspection system for the rotary electric machine according to embodiment 1. FIG. 2 is a schematic perspective view showing the configuration of the inspection device shown in FIG. 1. FIG. 3 is a schematic exploded perspective view showing the configuration of the inspection device shown in FIG. 2. FIG. 4 is a schematic sectional view along the axial direction showing the states of the rotary electric machine and the inspection device shown in FIG. 1.

In FIG. 1, a rotary electric machine 100 includes a stator 102 and a rotor 101 provided on the inner side of the stator 102 with a gap 103 therebetween. An inspection device 1 for a rotary electric machine (hereinafter, referred to as inspection device), which inspects the rotary electric machine 100, has such a dimension setting and a configuration that the inspection device 1 can be inserted and placed in the gap 103 between the inner circumferential surface of the stator 102 and the outer circumferential surface of the rotor 101 of the rotary electric machine 100, and the inspection device 1 inspects an inspection target part.

An inspection system 10 for a rotary electric machine (hereinafter, referred to as inspection system) includes the inspection device 1, a control unit 51 which controls movement of a probe 31 of the inspection device 1 in at least one of the circumferential direction Z and the radial direction X, and a display unit 52 which displays the state of the inspection device 1. The control unit 51 in embodiment 1 controls movement of the probe 31 in both of the circumferential direction 2 and the radial direction X. FIG. 1 shows a state in which the inspection device 1 is placed at a certain position in the gap 103. However, since the inspection device 1 is magnetically attracted to teeth 123 (see FIG. 6) of a core of the stator 102 formed by a ferromagnetic body at the inner circumferential surface of the stator 102, the inspection device 1 can be placed along the teeth 123 of the core of the stator 102 formed by a ferromagnetic body, at any position on the inner circumferential surface of the stator 102 or the outer circumferential surface of the rotor 101.

Therefore, as described in detail below, the inspection device 1 has a mechanism for being magnetically attracted to the ferromagnetic body at the inner circumferential surface of the stator 102, and inspects a wedge 120 (see FIG. 6) as an inspection target part provided at a groove 125 for storing a winding (not shown) of the rotor 101 of the rotary electric machine 100, while moving in the axial direction Y of the rotary electric machine 100. The wedge 120 is provided at each of grooves 125 of the rotor 101. Therefore, a plurality of wedges 120 as inspection target parts are present in the circumferential direction Z.

The inspection device 1, and the control unit 51 and the display unit 52, are connected via cables 61, 62.

The control unit 51 remotely controls the inspection device 1, and may include a user interface such as a keyboard, a mouse, a touch panel, or a joystick for receiving an input from outside. In a case where the inspection device 1, the control unit 51, and the display unit 52 have power supplies therein and are configured to communicate signals wirelessly, the cables 61, 62 may be omitted.

In FIG. 2 and FIG. 3, the inspection device 1 includes a base frame 21, traveling bodies 111, 112, an inspection unit 20 as a radial-movement portion for the probe 31, and a circumferential-adjustment unit 30 as a circumferential-movement portion for the probe 31. The inspection unit 20 is configured to be able to move the probe 31 in the radial direction X and store the probe 31 in the base frame 21. The traveling bodies 111, 112 move the base frame 21 in the axial direction Y in the gap 103. The traveling bodies 111, 112 are connected to both ends in the circumferential direction 2 of the base frame 21 via connection legs 121, 122 for connection. The connection legs 121, 122 are formed to be replaceable in accordance with the dimension of the gap 103.

The traveling bodies 111, 112 each include, for example, a crawler portion 401 which moves using a magnet and a magnetic attraction force and has a magnetic force generation device and a crawler belt, a first motor 402 which generates a driving force for the crawler portion 401, and a housing 403 storing these and formed by a nonmagnetic material such as aluminum, for example. The traveling bodies 111, 112 are attracted to the teeth 123 (see FIG. 6) of the core of the stator 102, and receive a signal from the control unit 51, to move and stop in the axial direction Y along the teeth 123 of the core of the stator 102.

The traveling bodies 111, 112 are supported by the connection legs 121, 122 so that the inspection unit 20 is located so as to keep appropriate gaps from the inner circumferential surface of the stator 102 and the outer circumferential surface of the rotor 101. The fixation positions of the connection legs 121, 122 are set so that traveling surfaces of the crawler portions 401 of the traveling bodies 111, 112 are located at the position of the core on the inner circumferential surface of the stator 102.

The traveling bodies 111, 112 may be formed using structures other than the crawler portions 401, and for example, wheels may be used. In addition, an encoder may be provided and a movement distance of the crawler portion 401 may be measured by measuring rotation of the first motor 402, for example. In addition, the traveling bodies 111, 112 may be fixed so that the crawler portions 401 are opposed to the outer circumferential surface of the rotor 101 instead of the inner circumferential surface of the stator 102, and may be attached to the outer circumferential surface of the rotor 101 and moved thereon.

The inspection unit 20 is provided at the base frame 21, and includes a linear-motion portion 22, a guide arm 231, guide portions 232, 233, and link portions 241, 242. The linear-motion portion 22 is, for example, a ball screw mechanism, and includes a ball screw 221, a second motor 222 which is attached to the ball screw 221 and generates a driving force, and a bearing 223. With a signal received from the control unit 51, the second motor 222 rotates to move the guide portions 232, 233 in one degree-of-freedom direction (axial direction Y) via the ball screw 221, thereby contracting/extending the link portions 241, 242. Thus, the circumferential-adjustment unit 30 is lifted or lowered in the radial direction X, i.e., the probe 31 of the circumferential-adjustment unit 30 is moved in the radial direction X.

The linear-motion portion 22 and the link portions 241, 242 are not limited to a configuration using the ball screw 221. For example, a mechanism such as a cylinder of a linear motor may be used, and any mechanism may be used as long as the probe 31 can be lifted, lowered, and moved in the radial direction X. A driving source therefor is not limited to electric means, and may be implemented using pneumatic, hydraulic, or manual means.

The circumferential-adjustment unit 30 is provided at the base frame 21, and includes a rack 32 and a pinion 33 as a rack-and-pinion mechanism, a third motor 34 for generating a driving force for the pinion 33, and a frame 35 having a guide groove 351.

In the circumferential-adjustment unit 30, with a signal received from the external control unit 51, the third motor 34 rotates the pinion 33 to move the probe 31 in a direction (circumferential direction 2) different from the above degree-of-freedom direction, along the rack 32 attached along the curvature of the arch shape of the frame 35. The probe 31 is supported and guided by a cam follower (not shown) and the guide groove 351, whereby loads on tooth tops of the rack 32 and the pinion 33 are reduced and dropping is prevented.

The base frame 21 and the frame 35 may have flat shapes, or may have arch shapes along the outer circumferential surface of the stator 102 or the inner circumferential surface of the rotor 101 of the rotary electric machine 100 and the arc lengths of their curved portions may be any length. The base frame 21 and the frame 35 may be provided with parts for storing the probe 31 and components such as motors, cable wires, and cables of other parts, and covers for protecting the inner surface of the rotary electric machine 100.

The inspection device 1 may be equipped with a camera facing in any direction, for the purpose of assisting remote control for operation of traveling in the axial direction Y, lifting/storing the circumferential-adjustment unit 30, and moving the probe 31 in the circumferential direction z, and may be equipped with a lighting device for allowing clear image information to be obtained by the camera. In addition, a laser distance meter or a laser pointer may be provided for bringing the probe 31 into contact with the wedge 120 of the rotor 101 precisely, and an acceleration sensor with three or more axes may be used for detecting the orientation of the probe 31. In embodiment 1, for performing the above operations, the circumferential-adjustment unit 30 is provided with a camera 36 and a laser distance meter 37. Then, an image from the camera 36 is displayed on the display unit 52, as the state of the inspection device 1.

FIG. 4 is a schematic sectional view along the axial direction Y showing a state in which the inspection device 1 is inserted into the gap between the stator 102 and the rotor 101 of the rotary electric machine 100. The gap 103 between the stator 102 and the rotor 101 of the rotary electric machine 100 is narrowest at an entrance 104. The inspection device 1 needs to be inserted to the inside and taken out from the inside, through the entrance 104. Therefore, when passing through the entrance 104 of the gap 103, the inspection device 1 operates the inspection unit 20 by a signal from the control unit 51, to contract the circumferential-adjustment unit 30 and the probe 31 in the radial direction X, so that the inspection device 1 passes in a state in which the circumferential-adjustment unit 30 and the probe 31 are stored.

Figure 5:
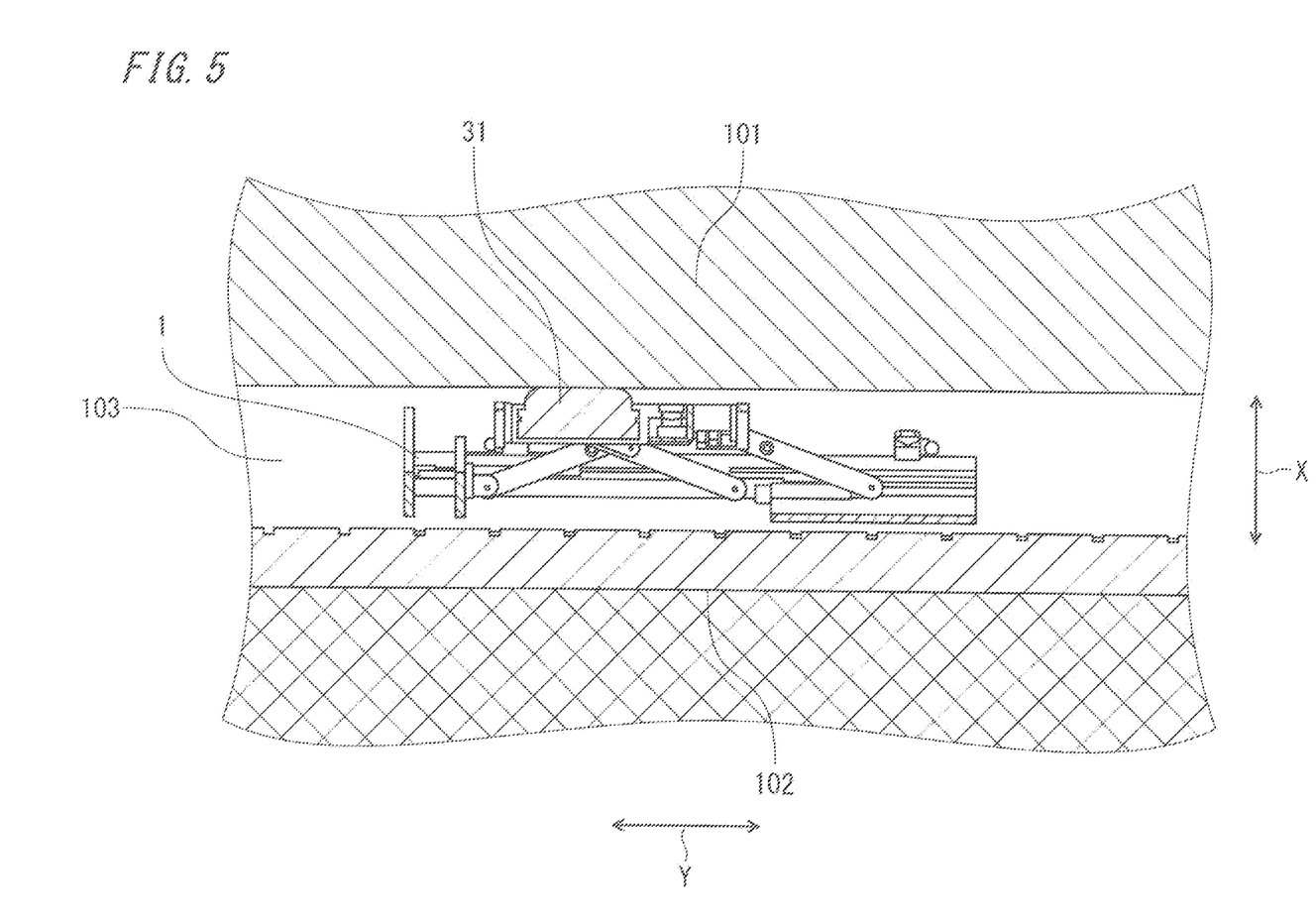
FIG. 5 is an enlarged sectional view of the rotary electric machine and the inspection device shown in FIG. 4.

FIG. 5 is a schematic sectional view along the axial direction Y showing the inspection device 1 in a state of inspecting the wedge 120 of the rotor 101 of the rotary electric machine 100. At the time of inspecting the wedge 120 at the surface of the rotor 101, the probe 31 is moved to the surface of the wedge 120 of the rotor 101 so as to contact therewith, thereby performing inspection. The probe 31 includes an ultrasonic sensor and a contact medium (not shown), for example. The ultrasonic sensor may be a phased-array type. As the contact medium, for example, a flexible material such as rubber or rubber filled with water or oil and sealed may be used to enhance the contact property of the probe 31, or water or oil may be applied on the surface of the probe 31 to enhance the contact property.

Figure 6:
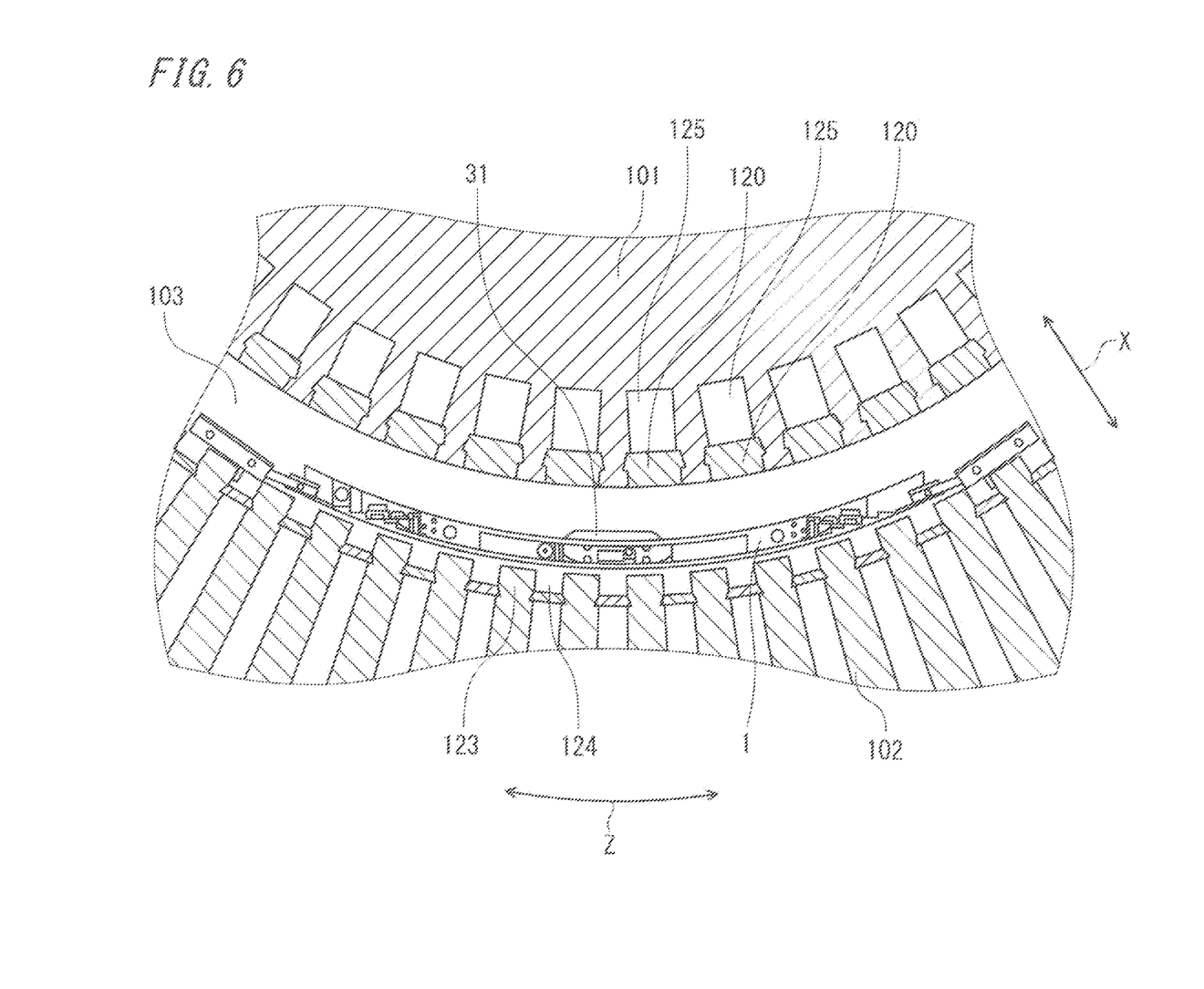
FIG. 6 is a sectional view showing a radial cross-section of the rotary electric machine and the inspection device shown in FIG. 4.
Figure 7:
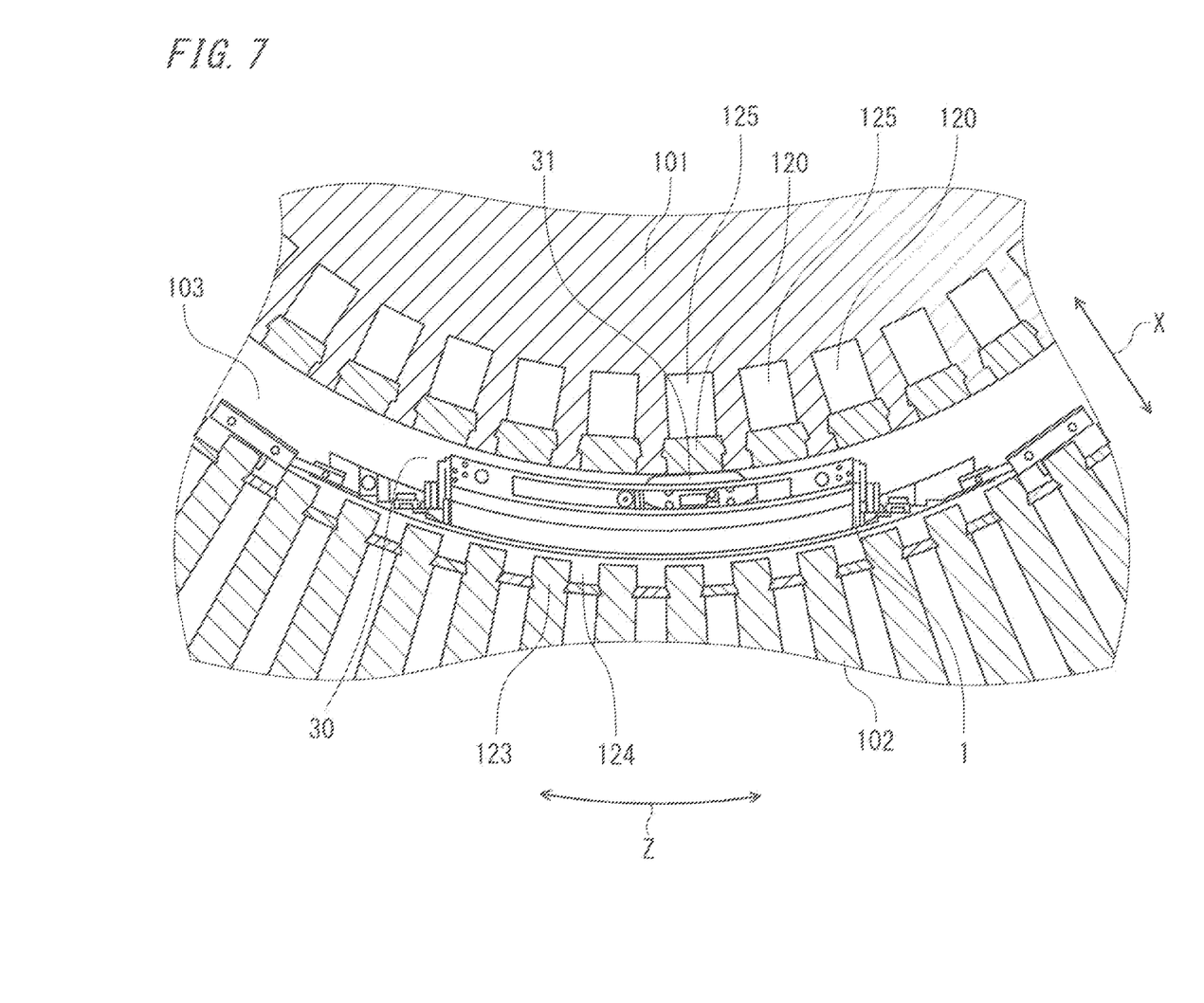
FIG. 7 is a sectional view showing a radial cross-section of the rotary electric machine and the inspection device shown in FIG. 4.

FIG. 6 and FIG. 7 are schematic sectional views along the radial direction X showing the inspection device 1 placed in the gap 103 between the rotor 101 and the stator 102 of the rotary electric machine 100 in embodiment 1. The stator 102 has grooves 124 arranged discontinuously on the inner circumferential surface in the core formed by a ferromagnetic body, and the traveling bodies are attracted along the teeth 123 of the core at the inner circumferential surface of the stator 102. The wedges 120 of the rotor 101 are located so as to be opposed to the stator 102, and the positional relationship thereof relative to arrangement of the grooves 124 of the stator 102 is indefinite in the circumferential direction Z. The circumferential-adjustment unit 30 is configured to move the probe 31 in the circumferential direction 2 in the inspection device 1 so that the probe 31 is opposed to the surface of the wedge 120 of the rotor 101, thus enhancing the contact property.

When the probe 31 is pressed to the surface of the wedge 120 of the rotor 101, for example, current of the second motor 222 for the ball screw 221 is controlled and limited, whereby the force of pressing the probe 31 is controlled. In addition, control is performed so as to finely change the contact state of the probe 31 and prevent destruction of a mechanism element.

Figure 8:
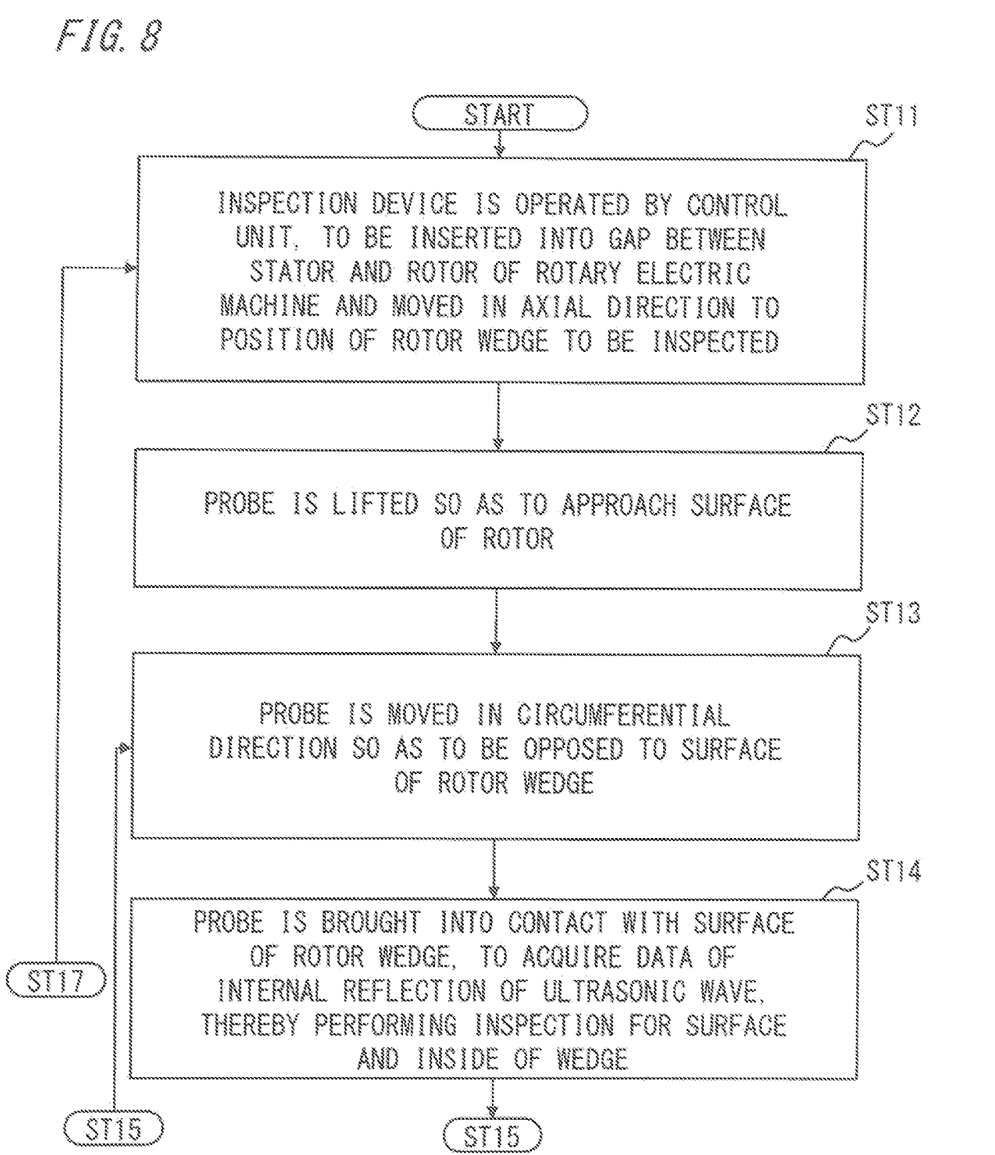
FIG. 8 is a flowchart showing an inspection method by the inspection device for the rotary electric machine shown in FIG. 1.
Figure 9:
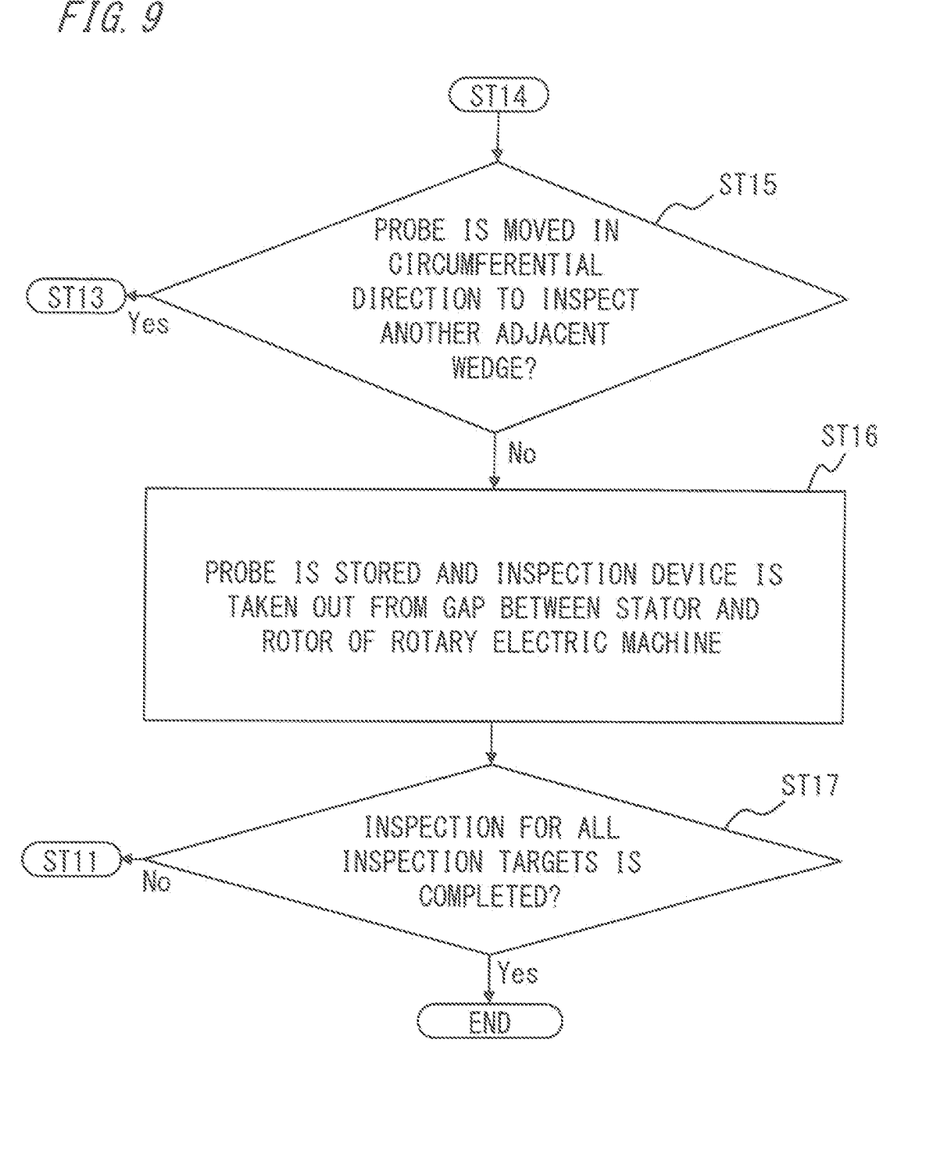
FIG. 9 is a flowchart showing the inspection method by the inspection device for the rotary electric machine shown in FIG. 1.

Next, an inspection method by the inspection device 1 for the rotary electric machine in embodiment 1 configured as described above will be described with reference to the drawings. FIG. 8 and FIG. 9 are flowcharts showing the inspection method by the inspection device for the rotary electric machine in embodiment 1. In embodiment 1, an example of performing full inspection for inspection target parts is shown. The order of movement of the probe 31 in steps in the flowcharts is merely an example, and may be changed as long as inspection for inspection target parts is achieved.

First, the inspection device 1 of the inspection system 10 is operated by the control unit 51, to be brought and inserted through the entrance 104 of the rotary electric machine 100 into the gap 103 between the rotor 101 and the stator 102. At this time, the inspection device 1 may be placed at the inner circumferential surface of the stator 102 or the outer circumferential surface of the rotor 101. Then, the inspection device 1 is operated by the control unit 51, to be moved in the axial direction Y to the position of the wedge 120 at the inspection target part of the rotor 101 (step ST11 in FIG. 8).

Next, in the inspection device 1, the circumferential-adjustment unit 30 including the probe 31 is lifted in the radial direction X so as to approach the surface of the rotor 101 by the linear-motion portion 22 and the link portions 241, 242 of the inspection unit 20, through operation by the control unit 51 (step ST12 in FIG. 8). Next, the third motor 34 connected to the pinion 33 of the circumferential-adjustment unit 30 is operated by the control unit 51, to move the probe 31 in the circumferential direction z to a position opposed to the surface of the wedge 120 at the inspection target part of the rotor 101 (step ST13 in FIG. 8). Thus, even if the position in the circumferential direction Z of the probe 31 of the inspection device 1 at the time of initial insertion is shifted from the position in the circumferential direction 2 of the wedge 120, the probe 31 can be assuredly placed at the position opposed to the wedge 120.

Next, the probe 31 is brought into contact with the surface of the wedge 120 of the rotor 101, to acquire data of internal reflection of an ultrasonic wave, thereby performing inspection for the surface and the inside of the wedge 120 (step ST14 in FIG. 8). Next, regarding the wedges 120 adjacent to the inspected wedge 120, whether or not another wedge 120 is present in a range where the probe 31 is movable in the circumferential direction 2 in the circumferential-adjustment unit 30 is determined (step ST15 in FIG. 9). If another wedge 120 is present (Yes), inspection is performed again from step ST13. In this case, in step ST13, the probe 31 is moved in the circumferential direction 2 to a position opposed to the other wedge 120.

If another wedge 120 is not present (No), the circumferential-adjustment unit 30 and the probe 31 are stored and the inspection device 1 is taken out from the gap 103 between the stator 102 and the rotor 101 in order to change placement of the inspection device 1 on the inner circumferential surface of the stator 102 (step ST16 in FIG. 9). Next, whether or not inspection for all the wedges 120 of the rotor 101 is finished is determined (step ST17 in FIG. 9). Then, if inspection for all the wedges 120 is not finished (No), inspection is restarted from step ST11. If inspection for all the wedges 120 is finished (Yes), the inspection is ended. Regarding the rotary electric machine 100 according to the present disclosure, the rotary electric machine 100 is inspected by the inspection device 1, whereby the inspection time can be shortened, and thus efficient operation of the rotary electric machine 100 can be achieved.

The inspection device for the rotary electric machine according to embodiment 1 configured as described above is an inspection device for a rotary electric machine, which inspects an inspection target part by being inserted into a gap between an inner circumferential surface of a stator and an outer circumferential surface of a rotor of the rotary electric machine, the inspection device including: a base frame; a traveling body which is attached to the base frame and moves the base frame in an axial direction in the gap; a probe which inspects the inspection target part; a radial-movement portion which moves the probe in a radial direction perpendicular to the axial direction and a circumferential direction; and a circumferential-movement portion which moves the probe in the circumferential direction in the base frame.

The inspection system for the rotary electric machine according to embodiment 1 includes: the above inspection device; a control unit which controls movement of the probe of the inspection device in at least one of the circumferential direction and the radial direction; and a display unit which displays a state of the inspection device.

The inspection method for the rotary electric machine according to embodiment 1 is an inspection method for a rotary electric machine, in which, by the above inspection device for the rotary electric machine, a plurality of inspection target parts at different locations in the circumferential direction are inspected in a state in which the rotor and the stator of the rotary electric machine are combined, the inspection method including the steps of: inserting the inspection device into the gap between the stator and the rotor and moving the inspection device to one of the inspection target parts; inspecting the one inspection target part by the probe; and moving the probe so as to be opposed to another one, of the inspection target parts, that is different from the one inspection target part and is included in a range where the probe is movable in the circumferential direction in the inspection device, and inspecting the other inspection target part.

Thus, since the probe can be moved in the circumferential direction in the inspection device, one or a plurality of inspection target parts can be inspected, constraints on movement of the inspection device can be reduced, efficiency of inspection work can be improved, and an inspection work period can be shortened.

In addition, since the probe can be moved in the circumferential direction in the inspection device, even if the inspection device is stopped at any position in the circumferential direction, the positional relationship between the inspection target part and the probe can be adjusted to be appropriate, and the probe can be brought into contact with the surface of the inspection target part appropriately. In addition, the frequency at which rotor position adjustment work is performed and the inspection device is placed again for inspection, can be reduced, the inspection can be facilitated, and the inspection can be performed in a short period. Further, since the probe can contact with the surface of the inspection target part appropriately, a signal obtained in accordance with defect at the surface of the inspection target part or inside thereof can become more accurate.

The traveling body is attached to the base frame via a connection leg for connection, and the connection leg is formed to be replaceable in accordance with a dimension of the gap.

Thus, since the connection leg can be replaced in accordance with the dimension of the gap in the rotary electric machine, versatility of the inspection device is enhanced.

The radial-movement portion is configured to be able to move the probe in the radial direction and store the probe in the base frame.

Thus, the probe can be prevented from obstructing insertion of the inspection device into the gap of the rotary electric machine.

The traveling body includes a crawler portion which, using a magnetic attraction force, moves along a ferromagnetic body at the inner circumferential surface of the stator or the outer circumferential surface of the rotor of the rotary electric machine, and a first motor which generates a driving force for the crawler portion.

Thus, movement of the inspection device in the axial direction can be easily performed.

The radial-movement portion controls a force for pressing the probe to the inspection target part.

Thus, the probe can contact with the inspection target part as appropriate without damaging the inspection target part or another part.

The radial-movement portion includes a linear-motion portion which operates in the axial direction, and a link portion which moves in the radial direction while linking with operation of the linear-motion portion, and the linear-motion portion includes a ball screw and a second motor which generates a driving force for the ball screw.

Thus, movement of the probe in the radial direction can be assuredly performed.

The circumferential-movement portion is formed by a rack-and-pinion mechanism having a rack and a pinion, and includes a third motor which generates a driving force for the pinion.

Thus, movement of the probe in the circumferential direction can be assuredly and easily performed.

The step of inspecting the probe includes a step of moving the probe to a position opposed to the inspection target part, and a step of moving the probe to a surface of the inspection target part.

Thus, the probe can be assuredly moved to the inspection target part, to perform inspection.

Figure 10:
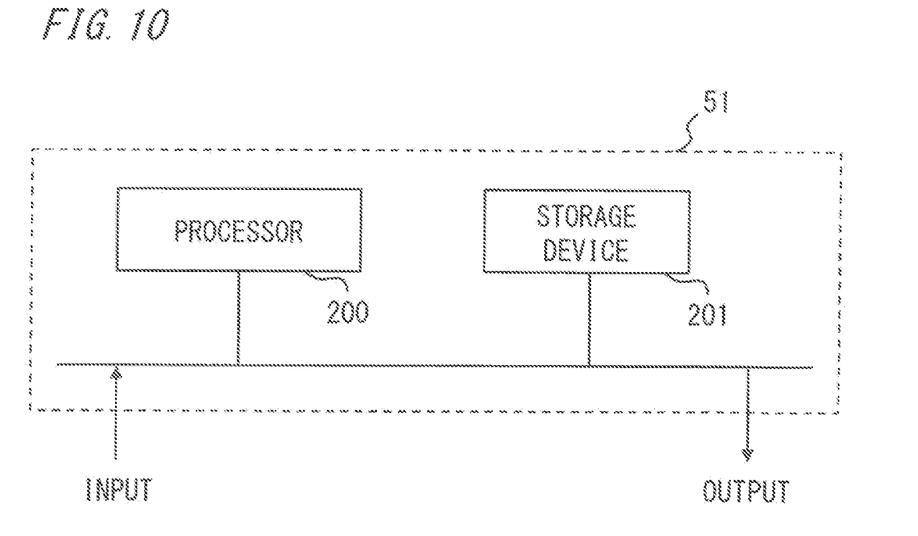
FIG. 10 is a block diagram showing the configuration of a control unit for the inspection device for the rotary electric machine shown in FIG. 1.

The control unit 51 is composed of a processor 200 and a storage device 201 as shown in FIG. 10 which shows a hardware example thereof. Although not shown, the storage device is provided with a volatile storage device such as a random access memory and a nonvolatile auxiliary storage device such as a flash memory. Instead of the flash memory, an auxiliary storage device of a hard disk may be provided. The processor 200 executes a program inputted from the storage device 201. In this case, the program is inputted from the auxiliary storage device to the processor 200 via the volatile storage device. The processor 200 may output data such as a calculation result to the volatile storage device of the storage device 201 or may store such data into the auxiliary storage device via the volatile storage device.

In the above description, the circumferential-movement portion for moving the probe in the circumferential direction in the base frame has been described. However, a circumferential-adjustment portion may be provided which moves the traveling body within the range of the width in the circumferential direction of the tooth of the stator, to adjust the position in the circumferential direction of the probe relative to the inspection target part. The circumferential-adjustment portion is obtained by a known circumferential-direction movement mechanism as described in US Patent Application Publication No. 2007/0089544, for example, but is not limited thereto.

The circumferential-adjustment portion adjusts the position in the circumferential direction of the probe relative to the inspection target part so as to compensate for a phase shift between the rotor and the stator. Here, the phase shift is, for example, a shift of the probe relative to the wedge at the inspection target part, and is a shift within the range of the width in the circumferential direction of the tooth of the stator. Thus, providing the circumferential-adjustment portion for adjusting the position in the circumferential direction of the probe within the range of the width in the circumferential direction of the tooth of the stator enables the probe to be opposed to the wedge at the inspection target part more accurately.

Although the disclosure is described above in terms of an exemplary embodiment, it should be understood that the various features, aspects, and functionality described in the embodiment are not limited in their applicability to the particular embodiment with which they are described, but instead can be applied alone or in various combinations to the embodiment of the disclosure.

It is therefore understood that numerous modifications which have not been exemplified can be devised without departing from the scope of the present disclosure. For example, at least one of the constituent components may be modified, added, or eliminated.

DESCRIPTION OF THE REFERENCE CHARACTERS

1 inspection device
10 inspection system
100 rotary electric machine
101 rotor
102 stator
103 gap
104 entrance
111 traveling body
112 traveling body
120 wedge
121 connection leg
122 connection leg 123 tooth
124 groove
125 groove
20 inspection unit
200 processor
201 storage device.
21 base frame
22 linear-motion portion
221 ball screw
222 second motor
223 bearing
231 guide arm
232 guide portion
233 guide portion
241 link portion
242 link portion
30 circumferential-adjustment unit
31 probe
32 rack
33 pinion
34 third motor
35 frame
351 guide groove
36 camera
37 laser distance meter
401 crawler portion
402 first motor
403 housing
51 control unit
52 display unit
61 cable
62 cable
X radial direction
Y axial direction
Z circumferential direction

The invention claimed is:

1. An inspection device for a rotary electric machine, which inspects an inspection target part by being inserted into a gap between an inner circumferential surface of a stator and an outer circumferential surface of a rotor of the rotary electric machine, the inspection device comprising:
a base frame;
a traveling body which is attached to the base frame and moves the base frame in an axial direction in the gap;
a probe which is carried by the base frame and inspects the inspection target part;
a radial-movement portion which moves the probe in a radial direction perpendicular to the axial direction and a circumferential direction relative to the traveling body; and
a circumferential-movement portion which moves the probe in the circumferential direction in the base frame relative to the traveling body.

2. The inspection device for the rotary electric machine according to claim 1, wherein
the traveling body is attached to the base frame via a connection leg for connection, and
the connection leg is formed to be replaceable in accordance with a dimension of the gap.

3. The inspection device for the rotary electric machine according to claim 2, wherein
the radial-movement portion is configured to be able to move the probe in the radial direction and store the probe in the base frame.

4. The inspection device for the rotary electric machine according to claim 2, wherein
the traveling body includes
a crawler portion which, using a magnetic attraction force, moves along a ferromagnetic body at the inner circumferential surface of the stator or the outer circumferential surface of the rotor of the rotary electric machine, and
a first motor which generates a driving force for the crawler portion.

5. The inspection device for the rotary electric machine according to claim 2, wherein
the radial-movement portion presses the probe to the inspection target part.

6. The inspection device for the rotary electric machine according to claim 2, wherein
the radial-movement portion includes a linear-motion portion which operates in the axial direction, and a link portion which moves in the radial direction while linking with operation of the linear-motion portion, and
the linear-motion portion includes a ball screw and a second motor which generates a driving force for the ball screw.

7. The inspection device for the rotary electric machine according to claim 1, wherein
the radial-movement portion is configured to be able to move the probe in the radial direction and store the probe in the base frame.

8. The inspection device for the rotary electric machine according to claim 7, wherein
the traveling body includes
a crawler portion which, using a magnetic attraction force, moves along a ferromagnetic body at the inner circumferential surface of the stator or the outer circumferential surface of the rotor of the rotary electric machine, and
a first motor which generates a driving force for the crawler portion.

9. The inspection device for the rotary electric machine according to claim 7, wherein
the radial-movement portion presses the probe to the inspection target part.

10. The inspection device for the rotary electric machine according to claim 7, wherein
the radial-movement portion includes a linear-motion portion which operates in the axial direction, and a link portion which moves in the radial direction while linking with operation of the linear-motion portion, and
the linear-motion portion includes a ball screw and a second motor which generates a driving force for the ball screw.

11. The inspection device for the rotary electric machine according to claim 1, wherein
the traveling body includes
a crawler portion which, using a magnetic attraction force, moves along a ferromagnetic body at the inner circumferential surface of the stator or the outer circumferential surface of the rotor of the rotary electric machine, and
a first motor which generates a driving force for the crawler portion.

12. The inspection device for the rotary electric machine according to claim 11, wherein
the radial-movement portion presses the probe to the inspection target part.

13. The inspection device for the rotary electric machine according to claim 1, wherein
the radial-movement portion presses the probe to the inspection target part.

14. The inspection device for the rotary electric machine according to claim 1, wherein
the radial-movement portion includes a linear-motion portion which operates in the axial direction, and a link portion which moves in the radial direction while linking with operation of the linear-motion portion, and
the linear-motion portion includes a ball screw and a second motor which generates a driving force for the ball screw.

15. The inspection device for the rotary electric machine according to claim 1, wherein
the circumferential-movement portion is formed by a rack-and-pinion mechanism having a rack and a pinion, and includes a third motor which generates a driving force for the pinion.

16. An inspection system for a rotary electric machine, comprising:
the inspection device for the rotary electric machine according to claim 1;
a controller which controls movement of the probe of the inspection device in at least one of the circumferential direction and the radial direction; and
a display which displays a state of the inspection device.

17. An inspection method for a rotary electric machine, in which, by the inspection device for the rotary electric machine according to claim 1, a plurality of inspection target parts at different locations in the circumferential direction are inspected using signals obtained from the probe in a state in which the rotor and the stator of the rotary electric machine are combined, the inspection method comprising the steps of:
inserting the inspection device into the gap between the stator and the rotor and moving the inspection device to one of the inspection target parts;
inspecting the one inspection target part by the radial-movement portion moving the probe to a surface of the inspection target; and
moving, by the circumferential-movement portion, the probe so as to be opposed to another one, of the inspection target parts, that is different from the one inspection target part and is included in a range where the probe is movable in the circumferential direction in the inspection device, and inspecting the other inspection target part by the radial-movement portion moving the probe to a surface of the other inspection target.

18. A rotary electric machine to be inspected using the inspection device according to claim 1.

* * * * *